United States Patent [19]
Iwata

[11] Patent Number: 5,475,700
[45] Date of Patent: Dec. 12, 1995

[54] LASER DIODE WITH ELECTRON AND HOLE CONFINEMENT AND BARRIER LAYERS

[75] Inventor: Hiroshi Iwata, Tokyo, Japan

[73] Assignee: Monda & Associates, Tokyo, Japan

[21] Appl. No.: 194,223

[22] Filed: Feb. 9, 1994

[30] Foreign Application Priority Data

Feb. 9, 1993 [JP] Japan ................................ 5-020912

[51] Int. Cl.$^6$ .................................................... H01S 3/18
[52] U.S. Cl. ................................ 372/45; 372/46
[58] Field of Search ........................... 372/45, 43, 46, 372/50; 257/13–15, 78

[56] References Cited

U.S. PATENT DOCUMENTS

| | | | |
|---|---|---|---|
| 3,927,385 | 12/1975 | Pratt, Jr. ................................... | 331/94.5 |
| 4,992,837 | 2/1991 | Sakai et al. ................................ | 372/45 |
| 5,010,376 | 4/1991 | Nishimura et al. ........................ | 372/45 |
| 5,045,897 | 9/1991 | Ahlgren ..................................... | 372/45 |
| 5,079,601 | 1/1992 | Esaki et al. ................................ | 372/45 |
| 5,081,632 | 1/1992 | Migita et al. .............................. | 372/45 |
| 5,266,814 | 11/1993 | Inata et al. ................................. | 257/21 |

FOREIGN PATENT DOCUMENTS 9324980  12/1993  WIPO ...................................... 372/45

OTHER PUBLICATIONS

English Language Abstract of Japanese Unexamined Publication No. 60–178682, Kentarou Onabe, Jan. 22, 1986, vol. 10, No. 16, pp. 275–277.

A. N. Baranov et al., "Quantum well laser with a single heterojunction," Soviet Technical Physics Letters, Jun. 1986, New York, vol. 12, No. 6.

M. C. Phillips et al., "Proposal and verification of a new visible light emitter based on wide band gap I–VI semiconductors," Applied Physics Letters, Oct. 19, 1992, New York, N.Y., vol. 61, No. 16, pp. 1962–1964.

Y. Rajakarunanayake et al., "Band alignment of ZnCdTe/ZnTe and ZnTeSe/ZnTe strained layer superlatices," Proceedings of the SPIE; Growth of Semiconductor Structures and High TC Thin Films on Semiconductors, Mar. 20–21, 1990, San Diego, Calif., vol. 1285, pp. 142–150.

Primary Examiner—Brian Healy
Assistant Examiner—Robert McNutt
Attorney, Agent, or Firm—Sughrue, Mion, Zinn, Macpeak & Seas

[57] ABSTRACT

A laser diode suitable for blue-green light emission utilizing type II heterojuctions of II–VI compound semiconductors. The laser diode comprises a layer 24 for confining electrons, a layer 26 for confining holes, and a quantum well layer which is formed bewteen the electron confinement layer 24 and the hole confinement layer 26 and allows the confined electrons and holes to recombine therein. The laser also comprises an electron barrier layer 23 and a hole barrier layer 27 for preventing diffusion of the electrons and holes beyond the barriers. The light emitted by the recombination is confined between the n-cladding layer 22 and a p-cladding layer 28.

17 Claims, 5 Drawing Sheets

- 29 p ELECTRODE
- 28 p CLADDING LAYER
- 27 HOLE BARRIER LAYER
- 26 HOLE CONFINEMENT LAYER
- 25 QUANTUM WELL LAYER
- 24 ELECTRON CONFINEMENT LAYER
- 23 ELECTRON BARRIER LAYER
- 22 n CLADDING LAYER
- 21 SEMICONDUCTOR SUBSTRATE
- 30 n ELECTRODE

FIG. 2B

CONDUCTION BAND EDGE — 31

VALANCE BAND EDGE — 32

LASER DIODE WITH ELECTRON AND HOLE CONFINEMENT AND BARRIER LAYERS

FIELD OF THE INVENTION

The invention relates to a laser diode having type II heterojunctions, and more particularly, to a II–VI compound laser diode suitable for emission of blue-green light.

KNOWN ART

It has been known that II–VI semiconductors have wide band gaps and are suitable for fabrication of blue-green laser diodes. In fact, a successful emission was demonstrated at 77K. See Applied Physics Letters, Vol. 59, (1991) 1272. A light emitting element utilizing II–VI semiconductor is also disclosed in Japanese Patent Early Publications 2-125477 and 2-196485.

However, laser diodes having a double-heterojunction structure of II–VI compounds lattice matched with a semiconductor substrate can not effectively confine both electrons and holes simultaneously in order to confine both electrons and holes, laser diodes must the fabricated from a combination of different materials having different lattice a constants. However, the laser will suffer from numerous dislocations caused by the misfit of different lattice constants of two different materials, which prevent continuous wave (cw) operation of blue-green light at room temperature.

It is therefore an object of the invention to provide a blue-green laser diode capable of cw operation at a room temperature.

It is another object of the invention to provide a II–VI blue-green laser diode capable of cw operation at a room temperature.

SUMMARY OF THE INVENTION

In one aspect of the invention, there is provided a laser diode comprising a semiconductor substrate and epitaxial layers lattice-matched with said substrate in the sequence of:

a p-cladding layer;

a hole barrier layer with p-type conduction forming an interface with said p-cladding layer;

a hole confinement layer forming an interface with said hole barrier layer, for confining therein holes;

an electron confinement layer forming an interface with said hole confinment layer, for confining therein electrons;

an electron barrier layer with n-type conduction forming an interface with said electron confinement layer; and an n-cladding layer forming an interface with said electron barrier layer, said electron confinement layer and said hole confinement layer forming a type II heterojuction, said semiconductor laser having a band line-up such that a potential for holes (hole potential) is low in said hole confinement layer and a potential for electrons (electron potential) is low in said electron confinement layer;

said hole potential being higher in said hole barrier layer than in said hole confinement layer;

said electron potential being higher in said electron barrier layer than in said electron confinement layer;

said p-cladding layer and said n-cladding layer having refractive indices smaller than at least one of the refractive indices of said hole confinement layer and said electron confinement layer.

In another aspect of the invention, there is provided a laser diode, comprising a semiconductor substrate and epitaxial layers lattice matched with said substrate in the sequence of:

an n-cladding layer;

an electron barrier layer with n-type conduction forming an interface with said electron barrier layer;

an electron confinement layer forming an interface with said electron barrier layer, for confining electrons therein;

a quantum well layer forming an interface with said electron confinement layer;

a hole confinement layer forming an interface with said quantam well layer, for confining holes therein;

a hole barrier layer with p-type conduction forming an interface with said hole donfinement layer; and a p-cladding layer forming an interface with said hole barrier layer, wherein said sequence of layers having a type II band line-up such that a potential for holes (hole potential) is low in said hole confinement layer and a potential for electrons (electron potential) is low in said electron confinement layer;

said hole potential and said electron potential are respectively lower in said quantum well layer than in said hole confinement layer and said electron confinement layer;

said hole potential being higher in said hole barrier layer than in said hole confinement layer;

said electron potential being higher in said electron barrier layer than in said electron confinement layer;

said p-cladding layer and said n-cladding layer having refractive indices smaller than at least one of the refractive indices of said hole confinement layer and said electron confinement layer.

Briefly stated, the invention employs so-called type II band structures in the hole confinement layer and the electron confinement layer, in which the potential for holes is low in the hole confinement layer and the potential for electrons is low in the electron confinement layer, thereby facilitating effective confinement of holes and electrons in the respective layers.

DETAILED DESCRIPTION OF THE PREFERRED EMBODIMENT

The invention is now described by way of example with reference to the accompanying drawings, in which like or corresponding components are numbered the same throughout the drawings.

Figure 1A:
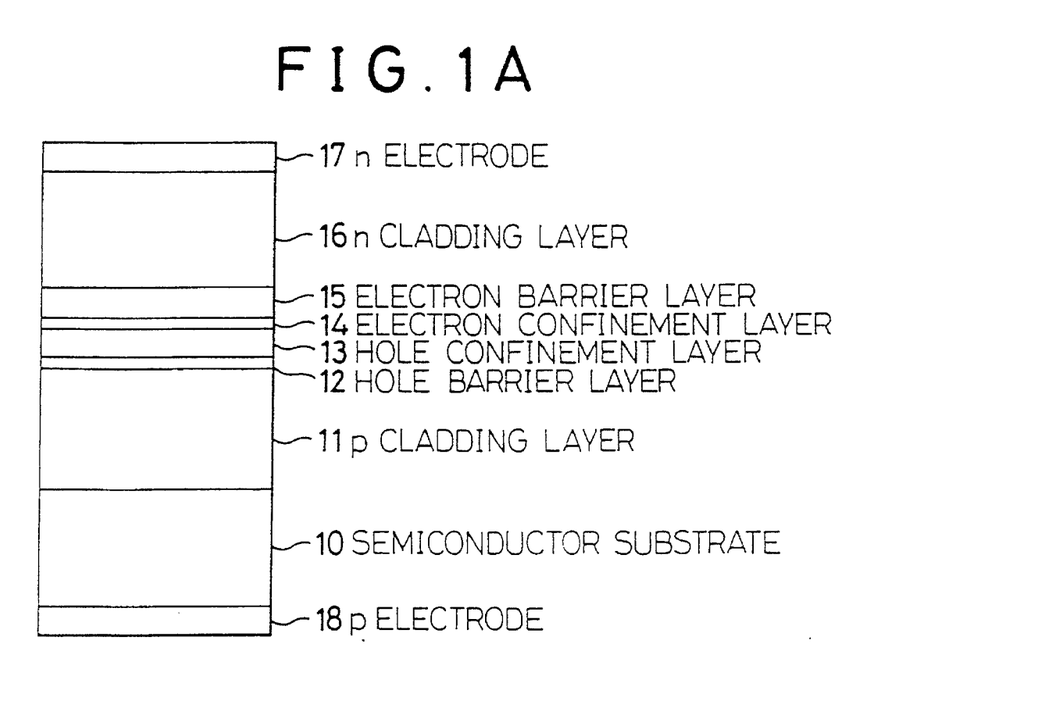
FIG. 1(A) and FIG. 1(B) illustrates a cross section of a laser diode defined by claim 1 along with the band line-up of the laser.
Figure 1B:
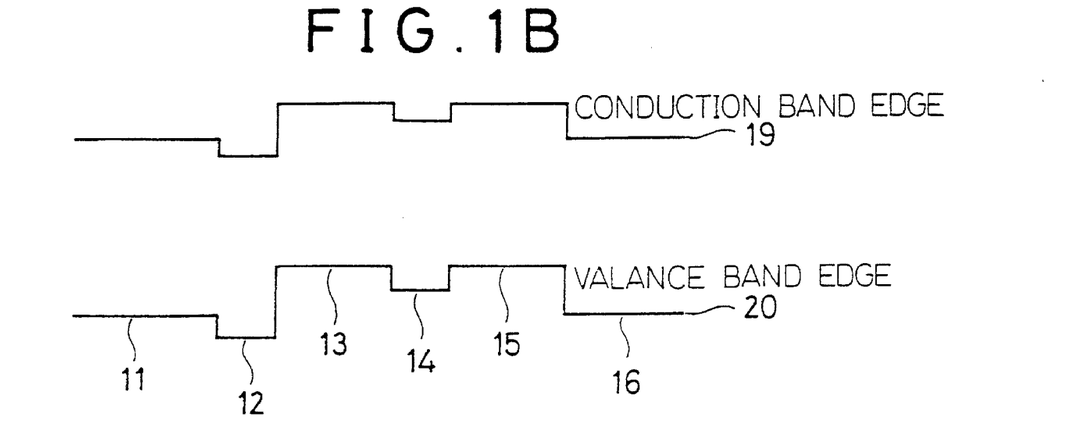

Referring now to FIG. 1(A) and FIG. 1(B), there is shown a first example of a laser diode in accordance with claim 1. FIG. 1(A) illustrates a multi-layer structure of the laser diode. FIG. 1(B) illustrates the band line-up of the laser of FIG. 1(A).

This laser diode is fabricated by growing on a p-type GaAs semiconductor substrate 10 the following semiconductor layers by molecular beam epitaxicy:

a p-cladding layer 11 ($p=1\times10^{18}$ cm−3, 30 nm thick) made of N-doped $Zn_{0.48}Cd_{0.52}S_{0.91}Se_{0.09}$;

a hole barrier layer 12 ($p=1\times10^{18}$ cm−3, 30 nm thick) made of N-doped $ZnO_{0.42}Cd_{0.58}S$;

a hole confinement layer 13 ($p=1\times10^{17}$ cm−3, 50 nm thick) made of N-doped $ZnSO_{0.09}Se_{0.91}$;

a electron confinement layer 14 (n-$1\times10^{17}$ cm−3, 30 nm thick) made of Cl-doped $ZnO_{0.71}Cd_{0.29}S_{0.55}Se_{0.45}$;

a electron barrier layer 15 ($n=1\times10^{18}$ cm−3, 50 nm thick) made of Cl-doped $ZnSO_{0.09}Se_{0.91}$;

a n-cladding layer 16 ($n=1\times10^{18}$ cm−3, 1μ thick) made of Cl-doped $ZnO_{0.48}Cd_{0.52}S_{0.91}SeO_{0.09}$, and then providing an Au n-electrode 17 and an AuZn p-electrode 18 using vacuum evaporation technique, and lastly cleaving facets forming reflective mirrors for the semiconductor laser.

These layers of the laser had defect-free, high quality crystal qualities, since they were each lattice matched with the semiconductor substrate 10. A typical working conduction band edge 19 and a valence band edge 20 are shown in FIG. 1(B). A ZnCdSSe compound heterojuction of the hole confinement layer 13 and the electron confinement layer 14 is of type II, in which the potential for the holes (hereinafter referred to as hole potential) is low in the hole confinement layer 13 and the potential for electrons (hereinafter referred to as electron potential) is low in the electron confinement layer 14. In addition, the hole potential is high in the hole barrier layer 12 and electron potential is high in the electron barrier layer 15, so that holes and electrons injected into the semiconductor laser diode will be trapped in the layers 13 and 14, respectively, thereby resulting in the population inversion required for (continuous wave blue-green light) lasing. The recombination of the electrons and holes proceeds in the heterogeneous interface (heterointerface) between the hole confinement layer 13 and the electron confinement layer 14, emitting desired laser light. The p-cladding layer 11 and the n-cladding layer 16 respectively have smaller refractive indices than the hole confinement layer 13 and the electron barrier layer 15, and, as a result, the light emitted by the recombination will be confined between the p-cladding layer 11 and the n-cladding layer 16, with its maximum intensity lying in the region of the heterointerface between the hole confinement layer 13 and the electron confinement layer 14.

Because of the effective confinement of holes and electrons in the respective confinement layers, and of successful confinement of light, cw operation of blue-green laser was easily attained at a room temperature.

Although in the first example described hereinabove and shown in FIG. 1 the p-cladding layer 11 and the hole barrier layer 12 are made of N-doped $Zn_{0.48}Cd_{0.52}S_{0.91}Se_{0.09}$ compound and N-doped $Zn_{0.42}Cd_{0.58}S$ compound, respectively, the layers 11 and 12 may be made of the same compound such as $Zn_{0.48}Cd_{0.52}S_{0.91}Se_{0.09}$ and $Zn_{0.48}Cd_{0.52}S$. The reason for this is that simultaneous confinement of both holes and light is possible in ZnCdSSe systems due to the fact that, in these ZnCdSSe compounds, the smaller the refractive indices is the higher the hole potential.

Also, instead of the p-type GaAs of the first example, another type of semiconductor such as n-type GaAs, InP, GaP, InAs, ZnSe, ZnTe may be used for the semiconductor substrate, and, instead of the epitaxialy grown semiconductor layers of ZnCdSSe, one of type II, epitaxial materials such as ZnCdSTe-, ZnCdSeTe-, HgCdSeTe-systems may be used as well.

Further, the epitaxial layers of the first example may alternatively substituted for by superlattices.

Figure 2A:
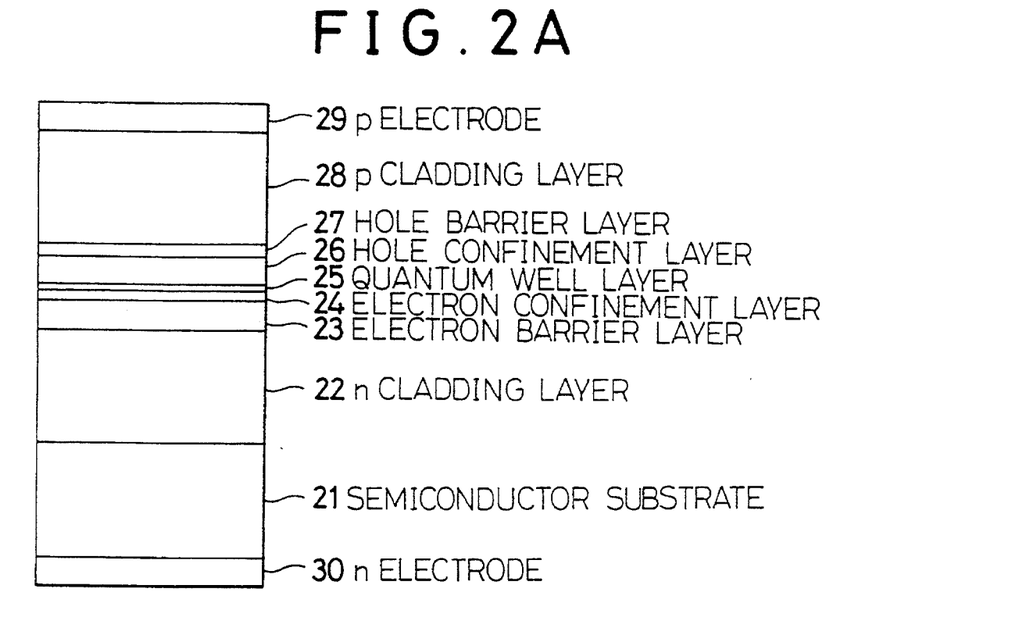
FIG. 2(A) and FIG. 2(B) illustrates a cross section of another laser diode defined by claim 10 along with the band line-up of the laser.
Figure 2B:
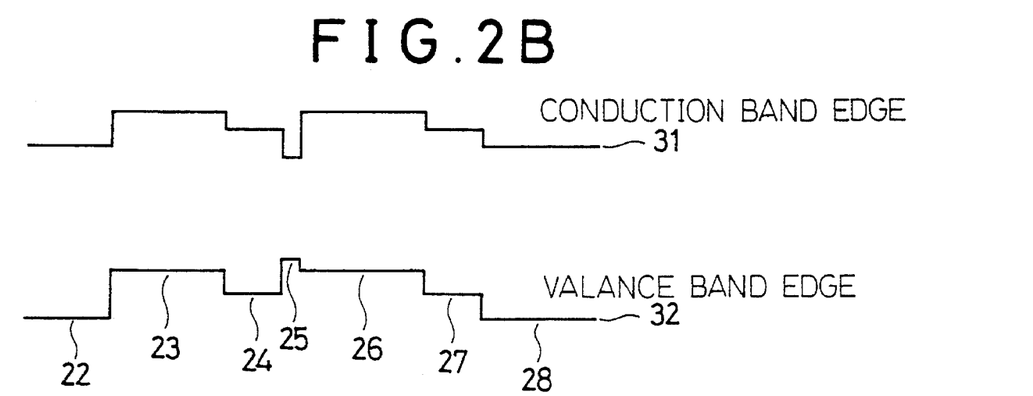

Referring now to FIG. 2(A) and FIG. 2(B), there is shown a second laser in accordance with claim 10. FIGS. 2(A) and 2(B) respectively illustrate the cross section of the laser and its band line-up.

Using molecular beam epitaxial technique, the second laser shown in FIG. 2(A) was fabricated by first growing, on a semiconductor substrate, the following layers in the sequence listed:

a n-cladding layer 22 ($n=1\times10^{18}$ cm−3, 1μ thick) made of Cl-doped $ZnTe_{0.46}Se0.54$;

a electron barrier layer 23 ($n=1\times10^{17}$ cm−3, 50 nm thick) made of Cl-doped $Zn_{0.52}Cd_{0.48}Se$, an electron confinement layer 24 (30 nm thick) made of $Zn_{0.76}Cd_{0.24}Te_{0.23}Se_{0.77}$, a quantum well layer 25 (7 nm thick) made of $Zn_{0.3}Cd_{0.7}Se$, a hole confinement layer 26 (50 nm thick) made of $Zn_{0.52}Cd_{0.48}Se$, a hole barrier layer 27 ($p=1\times10^{17}$ cm−3, 30 nm thick) made of N-doped $Zn_{0.76}Cd_{0.24}Te_{0.23}Se_{0.77}$, and a p-cladding layer 28 ($p=1\times10^{18}$ cm−3, 1μ thick) made of N-doped $Zn_{0.48}Cd_{0.52}S_{0.91}Se_{0.09}$, and then forming an Au p-electrode 29 and an AuGeNi n-electrode 30, and finally cleaving facets to form reflective mirrors.

The second laser diode has a conduction band edge 31 and valence band edge 32 as indicated by a band line-up shown in FIG. 2(B). It should be noted that the lattice constant (lattice length) of the quantum well layer 25 is longer than that of the semiconductor substrate 21, causing the quantum well to be strained. Other epitaxial layers are lattice-matched with the substrate 21. The quantum well layer 25 has a thickness of less than critical thickness and has scarce dislocation, thus exhibiting excellent emission efficiency.

Heterojunctions of ZnCdTeSe systems have so-called type II band line-ups in which a region of low hole potential is spaced apart from a region of low electron potential. As a result, these systems will not form a double heterojunctions which are commonly known to exist in III–V semiconductors.

In the second laser diode described above, electron potential is low in both the electron confinement layer 24 and quantum well layer 25, and high in the electron barrier layer 23 and the hole confinement layer 26, so that electrons confined in the electron confinement layer 24 may be (easily) injected into the quantum well layer 25. The hole potential is low in both the quantum well layer 25 and the hole confinement layer 26 but is high in the electron confinement layer 24 and in the hole barrier layer 27, so that holes confined in the hole confinement layer 26 may be (also easily) injected into the quantum well layer 25. The stress of the quantum well 25 changes the band structure and causes both of the hole and electron potentials in the well to be lowered, thus creating so-called type I structure. Consequently the electrons and holes injected into the well may effectively recombine to emit (blue-green) light.

Since the refractive indices of the electron barrier layer 23 and the hole confinement layer 26 are larger than the refractive indices of the n-cladding layer 22 and the p-cladding layer, emitted light is confined in a region between the n-cladding layer 22 and the p-cladding layer 28, with its maximum intensity being in the quantum well 25. Thus, cw lasing even at a room temperature was successfully observed.

It should be understood that, although the quantum well 25 of the second example is a single planar layer and has a strained structure, any one of alternative quantum wells such as lattice-matched type I quantum wells, multiple quantum wells, quantum wires, and quantum boxes may be used.

Also, it should be understood that, instead of the hole barrier layer 27 and p-cladding layer 28 having different compositions, these layers may be given the same composition if they are made of an ZnCdTeSe system, provided that the system has a smaller refractive index for a higher hole potential.

In the second example, the semiconductor substrate is an n-type InP, and the epitaxial layers are selected from ZnCdTeSe systems. However, an alternative semiconductor substrate such as p-type InP, GaAs, GaP, InAs, ZnSe, and ZnTe may be used equally well. Epitaxial layers may be selected from other type II materials such as ZnCdSTe, ZnCdSSe, and HgCdSeTe systems.

The epitaxial semiconductors in the second example may be substituted for by superlattices.

Figure 3:
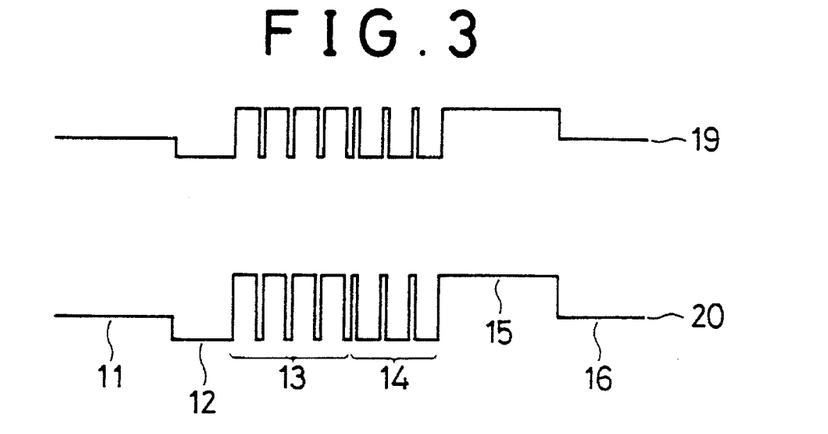
FIG. 3 illustrates a cross section of another laser diode defined by claim 4 along with the band line-up of the laser.

Referring to FIG. 3, there is shown a band line-up of a third example of the semiconductor laser in accordance with claim 4. The structure of this laser is basically the same as the first laser shown in FIG. 1 except that the hole confinement layer 13 of the first laser is replaced by a type II superlattice which has 10 periods of alternate $ZnS_{0.09}Se_{0.91}$ (4 nm thick)- $Zn_{0.42}Cd_{0.58}S$ (1 nm thick) layers, and the electron confinement layer 14 is replaced by a type II super lattice which has 6 periods of alternate $ZnS_{0.09}Se_{0.91}$ (1 nm thick) -$Zn_{0.42}Cd_{0.58}S$ (4 nm thick) layers. This semiconductor laser was also observed to lase continuously at room temperatures, resulting in emission of blue light.

In this laser, the hole potential is sufficiently low in the superlattice hole confinement layer 13, and the electron potential is sufficiently low in the superlattice electron confinement layer 14. It should be noted that the electron confinement layer 13 and the hole confinement layer 14 have lattices well matched with the substrate, and that superlattices reduce dislocation and defects. Thus, this type of laser diode exhibited a better over-all crystal qualities than the first laser. It should be also noted that a great degree freedom is obtained in designing laser diodes by simply controlling the thickness of the superlattices to thereby modify the hole and electron potentials in the confinement layers.

In the third example described above, the superlattices have a rectangular configuration in cross section, which may be changed to any other superlattice configuration of type II having, for example, a triangular-wave cross section.

Figure 4:
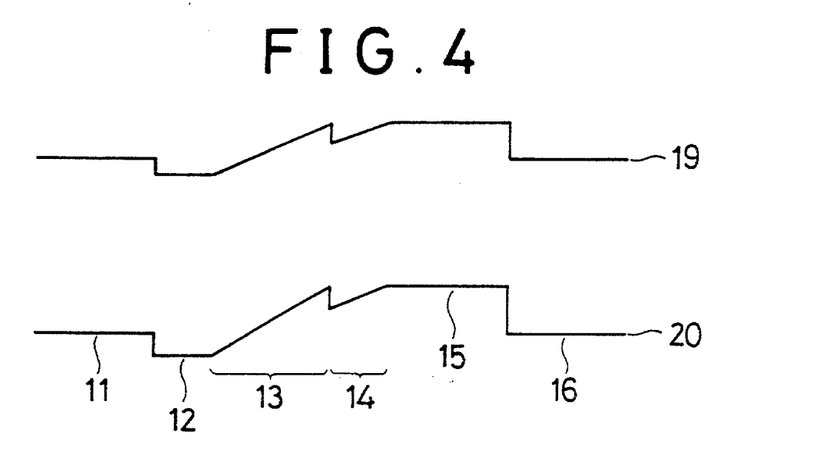
FIG. 4 illustrates a cross section of another laser diode defined by claim 5 along with the band line-up of the laser.

Referring to FIG. 4, there is shown a band line-up diagram of a laser diode in accordance with claim 5, which is a modification of the first laser defined by claim 1.

This arrangement is obtained by modifying the composition of the hole confinement layer 13 of the first example to $Zn_{1-0.58x}Cd_{0.58x}S_{0.09+0.91x}Se_{0.91-0.91x}$, and the composition of the electron confinement layer 14 to $Zn_{1-0.50y}Cd_{0.58y}S_{0.09+0.91y}Se_{0.91-0.91y}$, where x and y are fractional concentrations of relevant elements in the corresponding compounds. The value of x gradually decreases from 1 at the interface with the hole barrier layer 12 to 0 at the interface with the electron confinement layer 14. The thickness of the hole confinement layer 13 is 50 nm. The value of y gradually increases across the 30 nm thick electron confinement layer 14 from 0 at the interface with the electron barrier layer 15 to 0.5 at the interface with the hole confinement layer 13. Holes injected from the hole barrier layer 12 into the hole confinement layer will accumulate near the interface with the electron confinement layer 14 due to the potential gradient in the hole confinement layer 13. Electrons injected from the electron barrier layer 15 into the electron confinement layer 14 will also accumlate near the interface with the hole confinement layer 13 due to the potential gradient in the electron confinement layer 14. Consequently, the holes and the electrons that have collected near the interface will undergo recombination with a high recombination rate. A laser diode fabricated in this manner exhibited an improved quantum efficiency higher than the first laser by 10%.

Instead of using ZnCdSSe systems for the hole confinement layer and the electron confinement layer in the fourth example described above, CHIRP (coherent heterointerfaces for reflection and penetration) superlattices and other alternative material systems may be used equally well.

Figure 5:
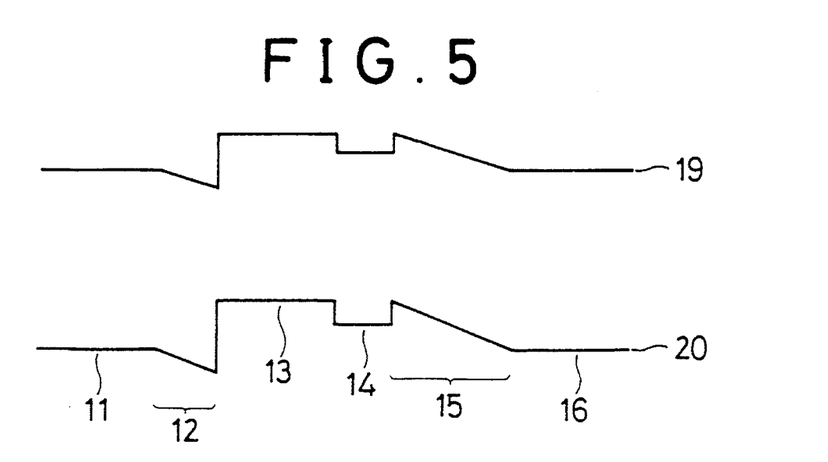
FIG. 5 illustrates a cross section of another laser diode defined by claim 7 along with the band line-up of the laser.

FIG. 5 illustrates a band line-up diagram of a fifth laser diode in accordance with claim 7, in which the arrangement of the multi-layers is basically the same as in the first example. However, a hole barrier layer 12 has composition N-doped $Zn_{1-0.58x}Cd_{0.58x}S_{0.09+0.91x}Se_{0.91-0.91x}$ and a electron barrier layer 15 has composition Cl-doped $Zn_{1-0.58y}Cd_{0.58y}S_{0.09+0.191y}Se_{0.91-0.91y}$, where x and y are fractional concentrations of the relevant components. The value of x gradually increases in the hole barrier layer 12 from 0.9 at the interface with the p-cladding layer 11 to 1 at the interface with the hole confinement layer 13. The hole barrier layer 12 has a thickness of 30 nm and N doping concentration of $1\times10^{18}$ cm−3. The value of y gradually increases in the electron barrier layer 15 from 0 at the interface with the electron confinement layer 14 to 0.9 at the interface with the n-cladding layer 16. The electron barrier layer 15 has a thickness of 50 nm and Cl doping concentration of $1\times10^{18}$ cm−3.

This type of laser diode has no heterobarrier for holes between the p-cladding layer 11 and the hole barrier layer 12, so that holes may easily cross the interface between the layers so that hole current may be easily injected into the hole confinement layer. Also, no heterobarrier for electrons exists between the n-cladding layer 16 and the electron barrier layer 15, so that electrons may be also injected easily. Consequently, a laser diode fabricated in this manner is lased at a lower lasing voltage than the first laser by 0.1 Volt, and consumes less power.

Instead of providing both the hole barrier layer 12 and the electron barrier layer 15 with linear gradients of composition, the compound layers may be provided with step-wise compositions.

Figure 6:
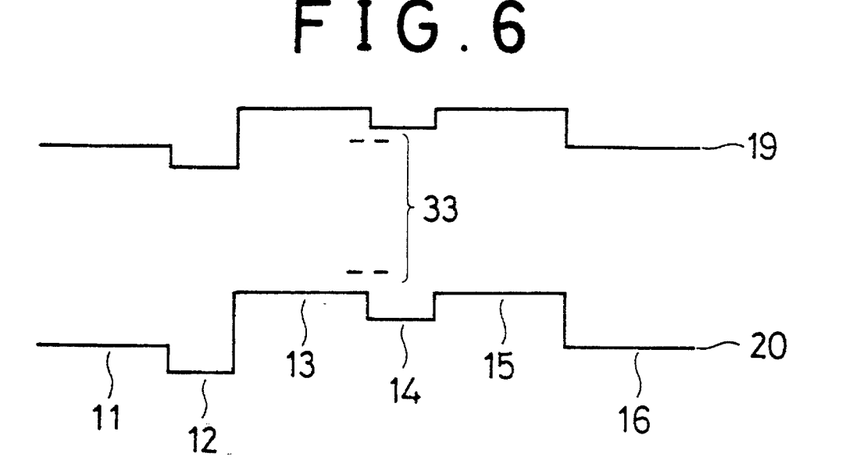
FIG. 6 illustrates a cross section of another laser diode defined by claim 9 along with the band line-up of the laser.

FIG. 6 illustrates a band line-up diagram of a laser diode in accordance with claim 9. This laser also has basically the same arrangement as the first laser except for varied compositions of the hole confinement layer 13 and the electron confinement layer 14. The composition of the hole confinement layer 13 is now $ZnS_{0.09}Se_{0.91}$, while the composition of the electron confinement layer 14 is $Zn_{0.71}Cd_{0.29}S_{0.55}Se_{0.45}$. The layers 13 and 14 are characterized by radiative recombination centers of Te doped in the regions near the interface of the hole confinement layer 13 and the electron confinement layer 14 to an extent of $1\times10^{20}$ cm−3. As shown in FIG. 6, the potential levels associated with the Te recombination centers (dotted lines) are lower than the band edges (solid lines) for both holes and electrons, so that the recombination of the holes and electron trapped near the centers may effectively proceed. In fact, experiment showed that the laser has a smaller threshold current for lasing than the first laser.

Te used in this laser may be substituted for by any other suitable element commonly known to serve as recombination centers.

Figure 7:
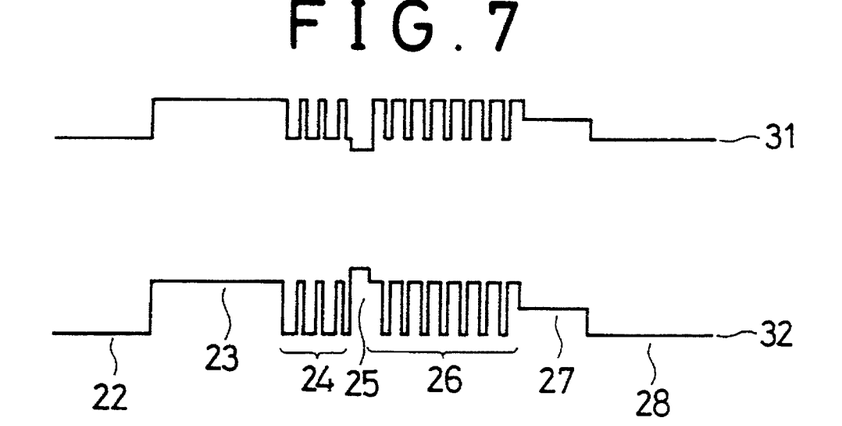
FIG. 7 illustrates a cross section of another laser diode defined by claim 11 along with the band line-up of the laser.

FIG. 7 illustrates another band line-up for a seventh laser diode in accordance with claim 12, which is also essentially the same in structure as the First laser except that this laser has an electron confinement layer 24 of type II superlattice consisting of 7 periods of alternate $ZnTe_{0.46}Se_{0.54}$ (3 nm thick) -$Zn_{0.52}Cd_{0.48}Se$ (1 nm thick) layers, and a hole confinement layer 26 of type II superlattice consisting of 12 periods of alternate $ZnTe_{0.46}Se_{0.54}$ (1 nm thick) -$Zn_{0.52}Cd_{0.48}Se$ (3 nm thick) layers.

The superlattice electron confinement layer 24 has an appropriately low potential for electrons for confining electrons therein, while the superlattice hole confinement layer 26 has an appropriately low potential for holes for confining holes therein.

Use of the superlattices may improve the over-all crystal qualities of the laser, thereby improving the quantum efficiency (defined by the ratio of the output power to the input power) of the laser.

The superlattices used in the seventh example described above are rectangular in cross section, which may be replaced by any of other type II superlattice having different cross sections, for example one having a triangular cross section.

Figure 8:
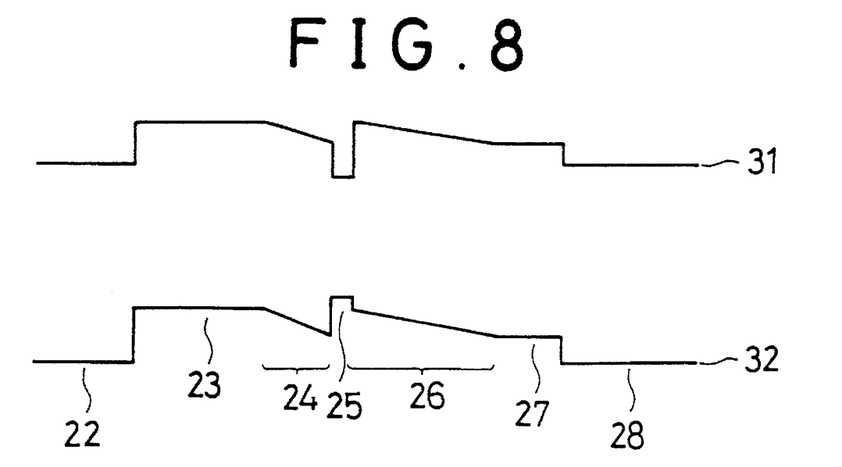
FIG. 8 illustrates a cross section of another laser diode defined by claim 12 along with the band line-up of the laser.

FIG. 8 illustrates still another band line-up diagram of a laser diode in accordance with claim 13, which has a multi-layer arrangement similar to the second example (defined by claim 10) but has different compositions for electron confinement layer 24 and hole confinement layer 26. The composition of the electron confinement layer 24 is $Zn_{0.52+0.48x}Cd_{0.48-0.48x}Se_{1-0.46x}Te_{0.46x}$ and the composition of the hole confinement layer 26 is $Zn_{0.52+0.48y}Cd_{0.48-0.48y}Se_{1-0.48y}Te_{0.48y}$, where x and y are fractional concentration of relevant elements in the respective compounds. The value of x increases in a monotonic fashion in the 30 nm thick electron confinement layer 24 from 0 at the interface with the electron barrier layer 23 to 0.5 at the interface with the quantum well layer 25. The value of y increases in a monotonic fashion in the 50 nm thick hole confinement layer 25 from 0 at the interface with a quantum well layer 25 to 0.5 at the interface with a hole barrier layer 27.

Because the potential for electrons decreases in the electron confinement layer 24 towards the quantum well layer 25, electrons may effectively drift from the electron confinement layer 24 to the quantum well layer 25. On the other hand, the potential for holes decreases in the hole confinement layer 26 towards the quantum well layer 25, so that holes may be effectively drift from the hole confinement layer 26 to the quantum well layer 25. Consequently, electrons and holes may recombine effectively in the quantum well layer 25, allowing for a high quantum efficiency.

Although the relative concentrations x and y varies continuously in the eighth example, x and y may vary equally well in steps. It should be understood that the above electron confinement layer 24 and the hole confinement layer 26 may be fabricated using CHIRP superlattices instead of ZnCdSeTe systems.

Figure 9:
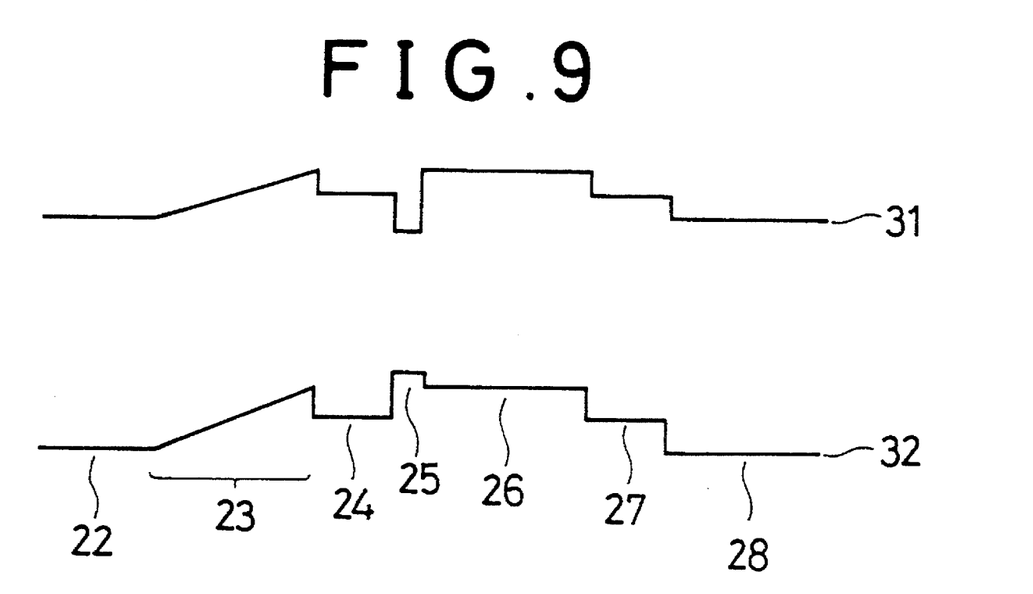
FIG. 9 illustrates a cross section of another laser diode defined by claim 14 along with the band line-up of the laser.

FIG. 9 illustrates a band line-up diagram of a laser diode according to claim 15, which is obtained by partly modifying the compositions of the electron barrier layer 23. The electron barrier layer 23 now has a composition of $Zn_{0.52+0.48x}Cd_{0.48-0.48x}Se_{1-0.48x}Te_{0.48x}$, where x decreases in a monotonic fashion in the electron barrier layer 23 from 1 at the interface with an n-cladding layer 22 to 0 at the interface with a electron confinement layer 24. The electron barrier layer 23 has a thickness of 50 nm and Cl doping concentration of $1\times10^{18}$ cm−3. Since there is no barrier for electrons at the interface between the n-cladding 22 and the electron barrier layer 23, electrons may be easily injected from the n-cladding layer 22 into the electron barrier layer 23 under low resistivity in laser operation. Lattice matching between the n -cladding layer 22 and the semiconductor substrate 21 also helps increase lasing efficiency.

Although the composition of the compounds layer 23 of FIG. 9 is varied continuously, it may be varied in steps. Further, the layer 23 may be fabricated using semiconductor materials other than ZnCdSeTe systems.

As described above in detail, the invention utilizes II–VI compound semiconductors forming type II heterojunctions, which make the hole potential low in the hole confinement layer and high in the hole barrier layer as well as in electron confinement layer, and makes the electron potential low in the electron confinement layer and high in the electron barrier layer as well as in the hole confinement layer, thereby facilitating effective confinement of holes and electrons in the respective confinement layers. Accumulation of each injected holes and electrons in the respective layers may result in effective recombination of the holes and the electrons in the heterojunction or the quantum well between the two confinement layers, emitting blue-green light, with a high quantum efficiency.

In addition to the recombination in the heterojunction, the quantum well and recombination centers having low potential for both holes and electrons may enhance such lasing, as described above.

The intensity of the light may be maximized in the region of the hole confinement layer and the electron confinement layer by appropriate choice of p- and n-cladding layers having sufficiently low refractive indices and by controlling the thicknesses of the hole barrier layer, the hole confinement layer, the electron confinement layer, and the electron barrier layer.

What I claim is:

1. A laser diode, comprising a semiconductor substrate and compound semiconductor layers lattice-matched with said substrate in a sequence of:

a p-cladding layer;

a hole barrier layer with p-type conduction forming an interface with said p-cladding layer;

a hole confinement layer forming an interface with said hole barrier layer, for confining therein holes;

an electron confinement layer forming an interface with said hole confinement layer, for confining therein electrons;

an electron barrier layer with n-type conduction forming an interface with said electron confinement layer; and an n-cladding layer forming an interface with said electron barrier layer, wherein said electron confinement layer and said hole confinement layer form a type II heterojunction, wherein said laser diode has a band line-up such that:

a potential for holes (hole potential) is low in said hole confinement layer and a potential for electrons (electron potential) is low in said electron confinement layer;

said hole potential is higher in said hole barrier layer than in said hole confinement layer; and said electron potential is higher in said electron barrier layer than in said electron confinement layer; and wherein said p-cladding layer and said n-cladding layer have refractive indices smaller than at least one of refractive indices of said hole confinement layer and said electron confinement layer.

2. A laser diode as claimed in claim 1, wherein said compound semiconductor layers are lattice-matched.

3. A laser diode as claimed in claim 1, wherein at lease one of said hole confinement layer and said electron confinement layer is a semiconducting superlattice layer.

4. A laser diode as claimed in claim 3, wherein at least one of said hole confinement layer and said electron confinement layer is a type II superlattice layer.

5. A laser diode as claimed in claim 1, wherein at least one of said hole confinement layer and said electron confinement layer is a type II superlattice layer.

6. A laser diode as claimed in claim 1, wherein said hole potential in said hole confinement layer increases with distance away from said interface with said electron confinement layer.

7. A laser diode as claimed in claim 1, wherein said electron potential in said electron confinement layer increases with distance away from said interface with said hole confinement layer.

8. A laser diode as claimed in claim 1, wherein said hole potential in said hole barrier layer increases with distance away from said interface with said p-cladding layer, said hole potential at said interface being equal to said hole potential in said p-cladding layer and said hole potential at said interface not exceeding said hole potential in said hole confinement layer.

9. A laser diode as claimed in claim 1, wherein said electron potential in said electron barrier layer increases with distance away from said interface with said n-cladding layer, said potential at said interface being equal to the electron potential in said n-cladding layer and not exceeding said electron potential in said electron confinement layer.

10. A laser diode as claimed in claim 1, wherein at least a portion of said hole confinement layer and said electron confinement layer is doped with impurities serving as radiative recombination centers.

11. A laser diode, comprising a semiconductor substrate and epitaxial layers lattice matched with said substrate in a sequence of:

an n-cladding layer;

an electron barrier layer with n-type conduction forming an interface with said n-cladding layer;

an electron confinement layer forming an interface with said electron barrier layer, for confining electrons therein;

a quantum well layer forming an interface with said electron confinement layer;

a hole confinement layer forming an interface with said quantum well layer, for confining holes therein;

a hole barrier layer with p-type conduction forming an interface with said hole confinement layer; and a p-cladding layer forming an interface with said hole barrier layer, wherein said sequence of layers have a type II band line-up such that:

a potential for holes (hole potential) is low in said hole confinement layer and a potential for electrons (electron potential) is low in said electron confinement layer;

said hole potential and said electron potential are lower in said quantum well layer than in said hole confinement layer and said electron confinement layer;

said hole potential is higher in said hole barrier layer than in said hole confinement layer; and said electron potential is higher in said electron barrier layer than in said electron confinement layer; and wherein said p-cladding layer and said n-cladding layer have refractive indices smaller than at least one of refractive indices of said hole confinement layer and said electron confinement layer.

12. A laser diode as claimed in claim 11, wherein said hole confinement layer and said electron confinement layer are type II compound layers.

13. A laser diode as claimed in claim 11, wherein said hole confinement layer and said electron confinement layer are type II superlattice layers.

14. A laser diode as claimed in claim 11, wherein said hole potential in said hole confinement layer increases with distance away from said interface with said quantum well layer.

15. A laser diode as claimed in claim 11, wherein said electron potential in said electron confinement layer increases with distance away from said interface with said quantum well layer.

16. A laser diode as claimed in claim 11, wherein said hole potential in said hole barrier layer increases with distance away from said interface with said p -cladding layer, said hole potential at said interface being equal to said hole potential in said p-cladding layer and not exceeding said hole potential in said hole confinement layer.

17. A laser diode as claimed in claim 11, wherein said electron potential in said electron barrier layer increases with distance from said interface with said n-cladding layer, said electron potential at said interface being equal to said electron potential in said n-cladding layer and not exceeding said hole potential in said electron confinement layer.

* * * * *

UNITED STATES PATENT AND TRADEMARK OFFICE
CERTIFICATE OF CORRECTION

PATENT NO. : 5,475,700
DATED : December 12, 1995
INVENTOR(S) : Hiroshi IWATA

It is certified that error(s) appears in the above-identified patent and that said Letters Patent is hereby corrected as shown below:

On title page,
At [73] Assignee: delete "Monda & Associates" and insert --NEC CORPORATION--.

Col. 1, line 55, delete "heterojuction" and insert --heterojunction--.

Col. 2, line 14, delete "quantam" and insert --quantum--.

Col. 2, line 16, delete "donfinement" and insert --confinement--.

Col. 2, line 36, delete "employes" and insert --employs--.

Col. 2, line 46, delete "illustrates" and insert --illustrate--.

Col. 2, line 49, delete "illustrates" and insert --illustrate--.

Col. 3, line 14, delete "epitaxicy" and insert --epitaxy--.

UNITED STATES PATENT AND TRADEMARK OFFICE
CERTIFICATE OF CORRECTION

PATENT NO. : 5,475,700
DATED : December 12, 1995
INVENTOR(S) : Hiroshi Iwata

It is certified that error appears in the above-indentified patent and that said Letters Patent is hereby corrected as shown below:

Col. 3, line 35, delete "heterojuction" and insert --heterojunction--.

Col. 6, line 14, after "layer" insert --13--.

Col. 7, line 56, delete (first occurrence) "25" and insert --26--.

Signed and Sealed this

Twenty-third Day of July, 1996

Attest:

BRUCE LEHMAN

Attesting Officer    Commissioner of Patents and Trademarks